United States Patent [19]

Adams et al.

[11] Patent Number: 4,785,140

[45] Date of Patent: Nov. 15, 1988

[54] SECURITY BOX FOR CABLE TV CONNECTORS

[75] Inventors: R. Eric Adams, Versailles; Joey L. Brown, Nicholasville; David B. Frodge, Lexington, all of Ky.

[73] Assignee: Moore Diversified Products, Inc., Lexington, Ky.

[21] Appl. No.: 93,598

[22] Filed: Sep. 8, 1987

[51] Int. Cl.$^4$ .............................................. H05K 5/00
[52] U.S. Cl. ........................................ 174/50; 174/48
[58] Field of Search ................. 174/48, 50, 52 R, 59, 174/60

[56] References Cited

U.S. PATENT DOCUMENTS

| | | | |
|---|---|---|---|
| 3,571,771 | 3/1971 | Stephanson | 174/50 X |
| 3,752,900 | 8/1973 | Harrison | 174/50 X |
| 3,996,415 | 12/1976 | Provorse | 174/48 |
| 4,370,516 | 1/1983 | Bailey, Jr. et al. | 174/48 X |

Primary Examiner—Arthur T. Grimley
Assistant Examiner—David A. Tone
Attorney, Agent, or Firm—Frank C. Leach, Jr.

[57] ABSTRACT

A security box includes a base having a support wall with four countersunk mounting holes through which mounting bolts extend to attach the base to a building wall while spacing the support wall from the building wall. The base has a top wall extending substantially perpendicular to the support wall and having L-shaped rails on its opposite sides within which a mounting plate for cable TV connectors is supported. A cover has a top wall overlying the top wall of the base with a flange on its rear to overlie the support wall. The cover also has a front wall, side walls, and a bottom wall with the bottom wall fitting between a flange at the bottom of the support wall of the base and a pair of L-shaped flanges extending forwardly from opposite sides of the support wall and inwardly towards each other. One of the flanges cooperates with a cam-type lock, which is mounted on the front wall of the cover, to lock the cover to the base. In one embodiment, the bottom wall of the cover has an access opening for the cable TV connectors. Another embodiment has an access opening in each of the cover side walls with a mounting plate having a portion, which extends downwardly from a supported flat portion, supporting the cable TV connectors thereon.

13 Claims, 2 Drawing Sheets

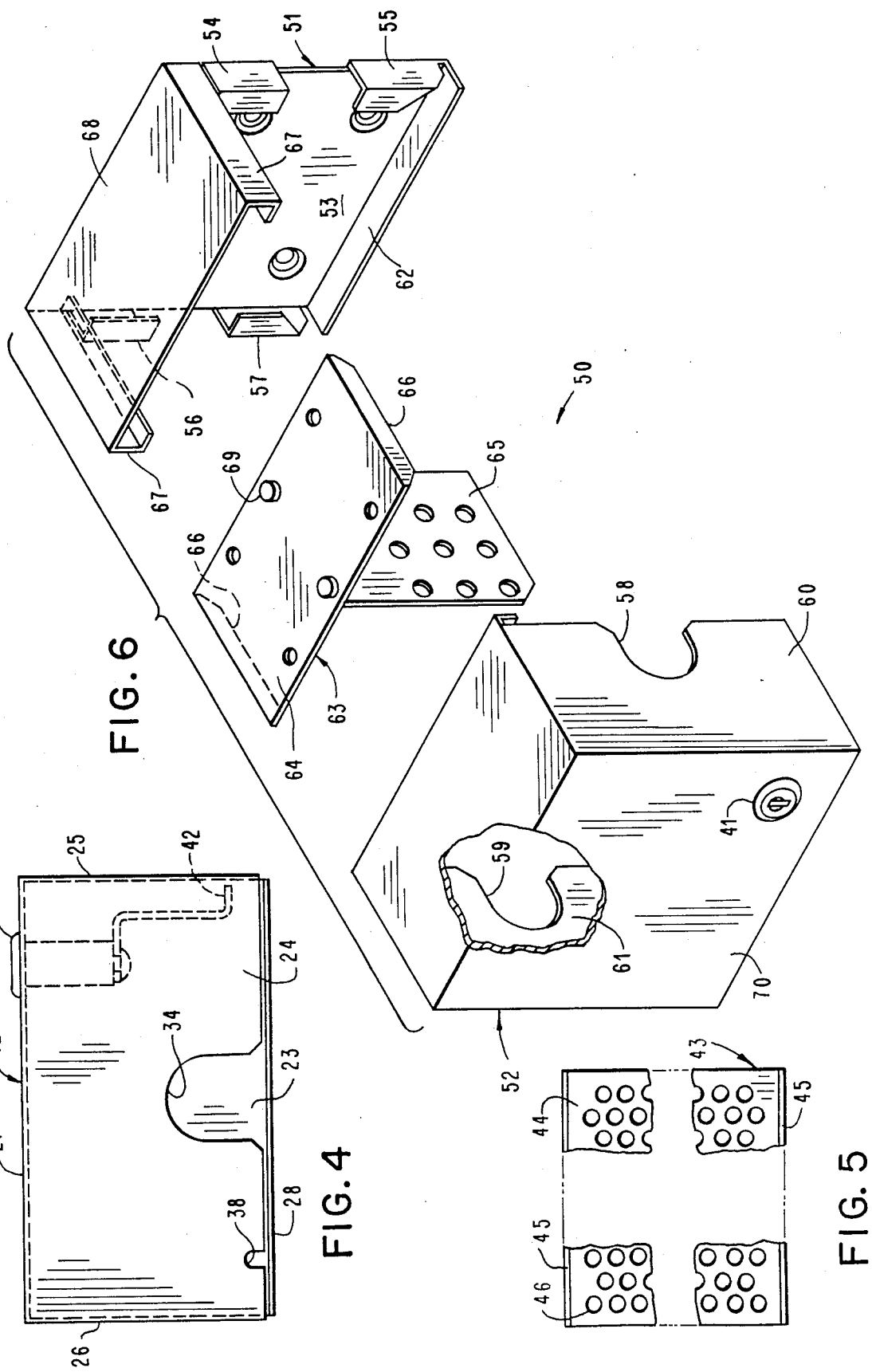

SECURITY BOX FOR CABLE TV CONNECTORS

This invention relates to a security box for connected cables and, more particularly, to a security box for cable TV connectors.

When supplying a cable TV signal to a plurality of apartments in a building, for example, the cable TV industry uses a single input cable to supply the signals to the apartment building. The single input cable is then either split within a connector box for connection to a plurality of output cables to each of the apartments or tapped by a plurality of output cables to each of the apartments to supply the signals to each of the apartments. In either arrangement, the single input cable is only connected to the output cables to those apartment occupants that are subscribers even though all apartments have output cables leading from the connector box. Thus, unauthorized accessibility must be prevented so that a non-subscribing apartment occupant cannot illegally connect the output cable to his or her apartment with the single input cable.

To avoid this, one previously suggested security box has mounted various cable TV splitters on a piece of plywood within a box having relatively deep walls. Access openings have been provided in the bottom wall of the box to allow a single input cable to enter and all of the output cables to the apartments to exit. At the same time, the splitters, which connect an input cable to a plurality of output cables to apartments, connect the input cable to the output cables exiting from the box to the apartments. A cover is mounted over the box and locked to prevent unauthorized access.

This prior security box has the disadvantages of being difficult for the worker to connect an output cable exiting to an apartment to the splitter because of the relatively deep walls of the box with the connecting parts fixed to the piece of plywood at the back of the box. As a result, it has been necessary to make the box with a relatively large area for the worker to have sufficient room to make the desired connections or disconnections. This prior security box also has necessitated substantial bending of some of the cables. Therefore, this previous security box has not been completely satisfactory because of its cost and the time required for a worker to make the desired connections and disconnections between the input cable and the output cables through the splitters.

Another previously suggested security box still has the deep walls, but uses a removable mounting bar within the box to support a tap on the input cable. This enables the worker to remove the mounting bar from the box and make any change in the tap on the input cable. However, this does not permit use of splitters because the shape of the bar will not permit mounting of the splitters. This security box has a straight in access for the input cable and the output cables so that they do not have to be bent for attaching to the mounting bar.

However, this prior security box is relatively expensive because its base, which is mounted on a building wall, has four relatively deep walls. It also uses two built-in cylinder locks in its cover to insure protection against unauthorized entry into the security box.

The security box of the present invention is an improvement of the previously suggested security boxes in that the base requires only a top wall. This permits easy access by a worker to any cable TV connectors supported within the security box of the present invention.

Additionally, the security box of the present invention employs a unique locking arrangement to avoid the necessity of having all walls of the box of the same depth. This significantly reduces the cost.

The security box of the present invention uses a relatively simple locking arrangement to insure that unauthorized entry cannot occur. The locking arrangement employs only a single lock, preferably a cam-type lock.

The security box of the present invention is capable of having cable access into the interior of the security box through either the bottom wall or side walls of its cover. This avoids excessive bending of any cable entering or exiting the security box.

The security box of the present invention has a mounting plate slidably supported by the top wall of its base. This enables the mounting plate to either be flat or T-shaped depending upon whether the cable access is in the bottom wall or the side walls of the security box cover.

An object of this invention is to provide a unique security box for cable TV connectors.

Other objects of this invention will be readily perceived from the following description, claims, and drawings.

This invention relates to a security box for cable TV connectors including a base having a support wall for mounting on a building wall. Support means, which extends from the support wall substantially perpendicular thereto, has slidably supporting means for slidably supporting mounting means, which support cable TV connectors. A cover is disposed over the base to prevent access to the base. The cover includes a front wall, a top wall extending substantially perpendicular to the front wall, a bottom wall extending substantially perpendicular to the front wall and substantially parallel to the top wall, and a pair of side walls extending from opposite sides of the front wall between the top wall and the bottom wall. When the cover is disposed over the base, the top wall overlies the support means of the base. The side walls of the cover extend to at least opposite sides of the support wall when the cover is disposed over the base. The support wall of the base has cooperating means for cooperating with the bottom wall of the cover when the cover is disposed over the base to prevent upward movement of the cover relative to the base. The support wall of the base has lock cooperating means to cooperate with a lock, which is supported by the cover, to lock the cover to the base when the cover is disposed over the base. The cover has cable access means in at least one of the bottom wall and the pair of side walls to provide cable access to the interior of the base when the cover is disposed over the base.

The attached drawings illustrate preferred embodiments of the invention, in which:

FIG. 4 is a bottom plan view of the cover of FIG. 1;

FIG. 5 is a fragmentary top plan view of a portion of another form of a cable connector mounting plate for use with the security box of FIG. 1; and FIG. 6 is an exploded perspective of another form of the security box of the present invention showing a base, a cover, and a mounting plate.

Figure 1:
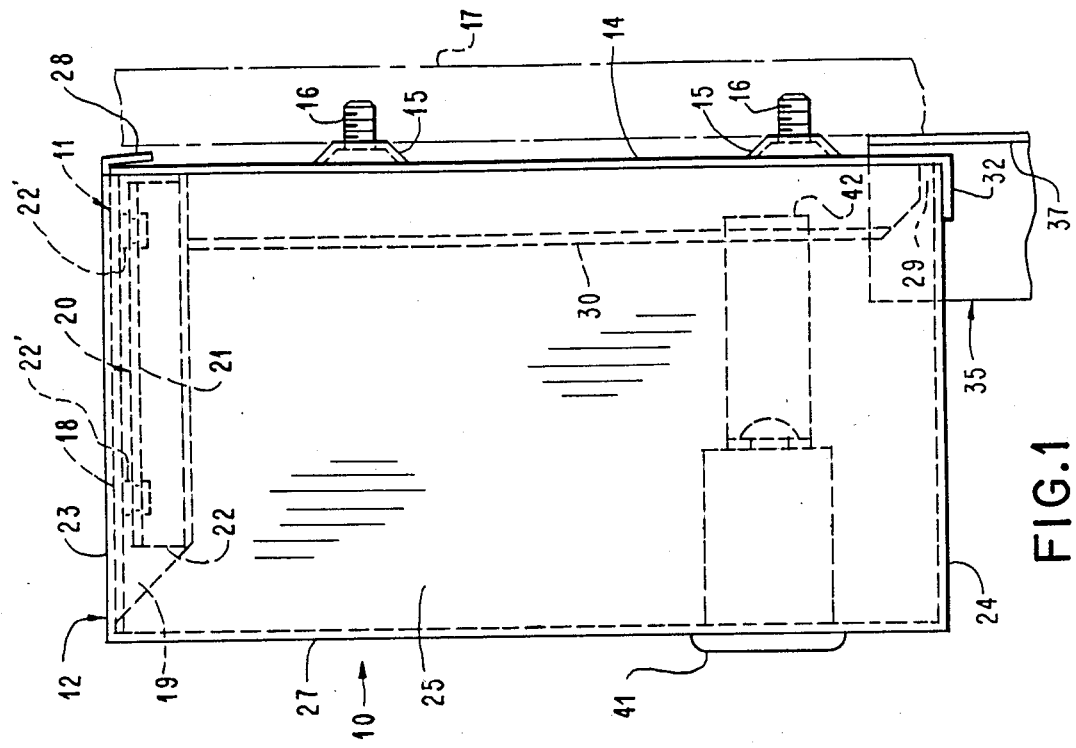
FIG. 1 is a side elevational view of a base of a security box of the present invention and having its cover mounted thereon and showing the base mounted on a building wall.

Referring to the drawings and particularly FIG. 1, there is shown a security box 10 including a base 11 and a cover or lid 12 cooperating with the base 11 to fit over the base 11 and enclose the base 11. The base 11 includes a support or rear wall 14 having four countersunk holes 15 therein through which mounting means such as mounting bolts 16, for example, extend into a building wall 17 (shown in phantom) to mount the base 11 on the building wall 17.

Figure 2:
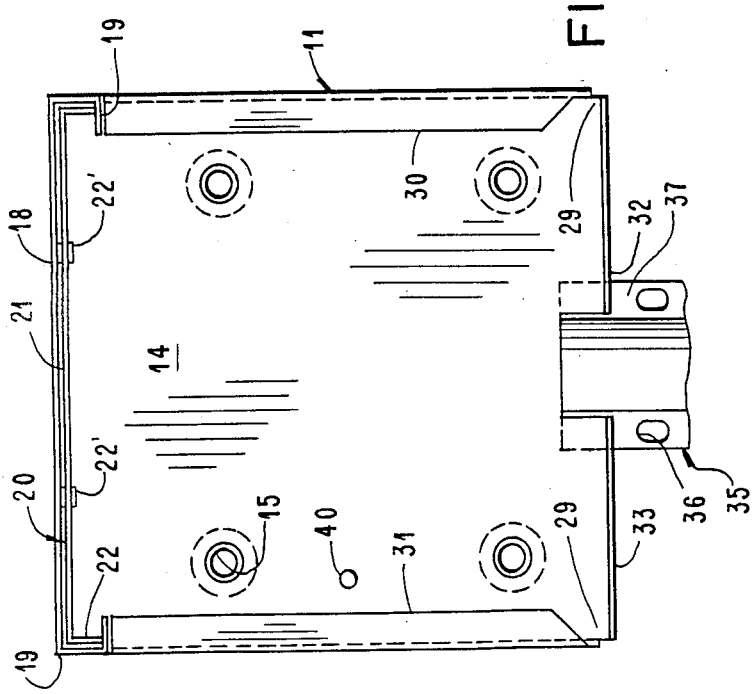
FIG. 2 is a front elevational view of the base of FIG. 1 with a cable connector mounting plate supported therein.

The base 11 has a top wall 18 extending forwardly from the support wall 14 and substantially perpendicular thereto. As shown in FIG. 2, opposite sides of the top wall 18 have L-shaped rails 19 to provide receiving means within which a mounting plate 20 may be slidably supported. The mounting plate 20 includes a flat portion 21 having cable TV connectors such as splitters (not shown), for example, supported thereon and end flanges 22 riding on the L-shaped rails 19. The splitters are attached to the flat portion 21 of the mounting plate 20 by rivets 22', which engage the bottom of the top wall 18 of the base 11 to provide a tight fit of the mounting plate 20 therewith. Thus, when it is desired to connect or disconnect an output cable to an input cable through a splitter, the mounting plate 20 may be easily withdrawn from the L-shaped rails 19 after the cover 12 (see FIG. 1) is removed.

The cover 12 includes a top wall 23, a bottom wall 24, and side walls 25 and 26 (see FIG. 4) extending substantially perpendicular from a front wall 27. The top wall 23, which overlies the top wall 18 (see FIG. 1) of the base 11, extends beyond the edges of the bottom wall 24 and the side walls 25 and 26 of the cover 12 as shown in FIG. 4.

By the top wall 23 extending beyond the bottom wall 24 and the side walls 25 and 26, a flange 28 (see FIG. 1), which extends downwardly from the top wall 23 at an angle slightly greater than 90° such as 95°, for example, overlies the support wall 14 of the base 11. Because the countersunk holes 15 protrude beyond the support wall 14, there is space for the flange 28 to fit between the support wall 14 of the base 11 and the building wall 17.

The bottom wall 24 of the cover 12 rests in notches 29, which are formed between the bottom ends of L-shaped flanges 30 and 31 (see FIG. 2) extending forwardly from opposite sides of the support wall 14 and inwardly toward each other and a pair of flanges 32 and 33 extending forwardly from the bottom of the support wall 14. Thus, the cover 12 (see FIG. 1) is securely retained on the base 11 by the flange 28 overlying the support wall 14 and the bottom wall 24 fitting within the notches 29. Accordingly, the base 11 is enclosed by the cover 12 even though the base 11 does not have any side walls or a bottom wall other than the L-shaped flanges 30 and 31 (see FIG. 2) at the sides of the support wall 14 and the flanges 32 and 33 at the bottom of the support wall 14.

Figure 3:
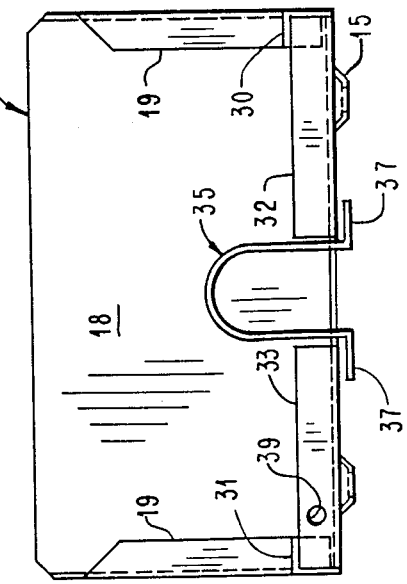
FIG. 3 is a bottom plan view of the base of FIG. 1 without a cable connector mounting plate.

With the cover 12 (see FIG. 1) so disposed, an input cable and output cables can enter and leave the interior of the security box 10 through an access opening 34 (see FIG. 4) in the bottom wall 24 of the cover 12. The flanges 32 (see FIG. 3) and 33 are spaced from each other so that the cables extending through the access opening 34 (see FIG. 4) also pass between the flanges 32 (see FIG. 3) and 33.

The cable enter into the access opening 34 (see FIG. 4) in the bottom wall 24 of the cover 12 through a riser guard 35, which is secured to the building wall 17 (see FIG. 1) by screws (not shown) or the like extending through slots 36 (see FIG. 2) in flanges 37 of the riser guard 35.

It also is necessary to have a ground wire access opening 38 (see FIG. 4) in the bottom wall 24 of the cover 12. The ground wire also passes through a hole 39 (see FIG. 3) in the flange 33 of the base 11. The ground wire is attached to a lug 40 (see FIG. 2) on the support wall 14 of the base 11.

The front wall 27 (see FIG. 4) of the cover 12 supports a cam-type lock 41 having a locking flange 42 that moves behind the L-shaped flange 30 (see FIG. 1) when the cover 12 is mounted on the base 11 and the lock 41 is moved to its locking position. Therefore, the cover 12 is retained in a position in which unauthorized entry into the interior of the security box 10 cannot occur.

Instead of the mounting plate 20 being used, a mounting plate 43 (see FIG. 5) may be utilized. The mounting plate 43 includes a flat portion 44 having end flanges 45 extending upwardly therefrom. The flat portion 44 (see FIG. 5) has its portions adjacent the end flanges 45 riding on the L-shaped rails 19 (see FIG. 2).

The flat portion 44 of the mounting plate 43 has numerous holes 46 therein to receive screws for mounting splitters (not shown). The holes 46 would be ⅛" in diameter and staggered on 3/16" centers throughout the flat portion 44 of the mounting plates 43. Because of the absence of the rivets 22' (see FIG. 1) as used with the mounting plate 20, it is necessary for the upper surface of each of the end flanges 45 (see FIG. 5) to engage the bottom of the top wall 18 (see FIG. 1) of the base 11 to enable the mounting plate 43 to have a tight fit therewith.

Referring to FIG. 6, there is shown a security box 50 including a base 51 and a cover 52. The base 51 is substantially the same as the base 11 (see FIG. 1) except that its support wall 53 (see FIG. 6) has two L-shaped flanges 54 and 55 extending from one of its sides and two L-shaped flanges 56 and 57 extending from its other side. The L-shaped flanges 54 and 55 are spaced from each other, and the L-shaped flanges 56 and 57 are spaced from each other. This is because cable access to the interior of the security box 50 is through cable access openings 58 and 59 in side walls 60 and 61, respectively, of the cover 52. The support wall 53 of the base 51 has a continuous flange 62 at its bottom since there is no cable access at the bottom.

Because the security box 50 has the cable access through the side walls 60 and 61 of the cover 52, a T-shaped mounting plate 63 is employed to support the cable TV connectors such as splitters (not shown). The T-shaped mounting plate 63 has a flat portion 64 and a portion 65 substantially perpendicular thereto on which the splitters are mounted. The flat portion 64 has a pair of end flanges 66 for riding in L-shaped rails 67 extending downwardly from opposite sides of a top wall 68 of the base 51. The flat portion 64 of the mounting plate 63 has the portion 65 attached thereto by rivets 69, which engage the bottom of the top wall 68 of the base 51 to provide a tight fit of the mounting plate 63 therewith.

In this embodiment, the L-shaped flange 55 retains the flange 42 (see FIG. 4) of the lock 41, which is supported in a front wall 70 (see FIG. 6) of the cover 52. Thus, the cover 52 is locked to the base 51 by the lock 41.

An advantage of this invention is its relatively low cost. Another advantage of this invention is that a worker has easy access to connect and disconnect cable TV connectors since there is only a top wall and the connector mounting means is removable.

For purposes of exemplification, particular embodiments of the invention have been shown and described according to the best present undertanding thereof. However, it will be apparent that changes and modifications in the arrangement and construction of the parts thereof may be resorted to without departing from the spirit and scope of the invention.

We claim:

1. A security box for cable TV connectors including:
   a base having a support wall for mounting on a building wall;
   support means extending from said support wall substantially perpendicular thereto;
   mounting means for supporting cable TV connectors;
   said support means having slidably supporting means for slidably supporting said mounting means;
   a cover for disposition over said base to prevent access to said base;
   said cover including:
     a front wall;
     a top wall extending substantially perpendicular to said front wall;
     a bottom wall extending substantially perpendicular to said front wall and substantially parallel to said top wall;
     a pair of side walls extending from opposite sides of said front wall between said top wall and said bottom wall;
     said top wall overlying said support means of said base when said cover is disposed over said base;
     and said side walls extending to at least opposite sides of said support wall when said cover is disposed over said base;
   said support wall of said base having cooperating means for cooperating with said bottom wall of said cover when said cover is disposed over said base to prevent upward movement of said cover relative to said base;
   a lock supported by said cover;
   said support wall of said base having lock cooperating means to cooperate with said lock to lock said cover to said base when said cover is disposed over said base;
   and said cover having cable access means in at least one of said bottom wall and said pair of side walls to provide cable access to the interior of said base when said cover is disposed over said base.

2. The security box according to claim 1 in which:
   said support wall has spacing means for disposing said support wall in spaced relation to a building wall on which said support wall is mounted;
   and said top wall of said cover has a locking flange extending from its rear for disposition behind said support wall when said cover is disposed over said base.

3. The security box according to claim 2 in which:
   said support means includes a wall extending substantially perpendicular to said support wall;
   and said slidably supporting means includes a pair of L-shaped rails extending downwardly from opposite sides of said extending wall to support said mounting means.

4. The security box according to claim 1 in which:
   said support means includes a wall extending substantially perpendicular to said support wall;
   and said slidably supporting means includes a pair of L-shaped rails extending downwardly from opposite sides of said extending wall to support said mounting means.

5. A security box for cable TV connectors including:
   a base having a support wall for mounting on a building wall;
   said support wall having spacing means for disposing said support wall in spaced relation to a building wall on which said support wall is mounted;
   support means extending from said support wall substantially perpendicular thereto;
   mounting means for supporting cable TV connectors;
   said support means having slidably supporting means for slidably supporting said mounting means;
   a cover for disposition over said base to prevent access to said base;
   said cover including:
     a front wall;
     a top wall extending substantially perpendicular to said front wall;
     a bottom wall extending substantially perpendicular to said front wall and substantially parallel to said top wall;
     a pair of side walls extending from opposite sides of said front wall between said top wall and said bottom wall;
     said top wall overlying said support means of said base when said cover is disposed over said base;
     said top wall having a locking flange extending from its rear for disposition behind said support wall when said cover is disposed over said base;
     and said side walls extending to at least opposite sides of said support wall when said cover is disposed over said base;
   said support wall of said base having receiving means for rceiving a portion of said bottom wall of said cover when said cover is disposed over sad base to prevent upward movement of said cover relative to said base;
   a lock supported by said cover;
   said support wall of said base having lock cooperating means to cooperate with said lock to lock said cover to said base when said cover is disposed over said base;
   and said cover having cable access means in at least one of said bottom wall and said pair of side walls to provide cable access to the interior of said base when said cover is disposed over said base.

6. The security box according to claim 5 in which:
   said support means includes a wall extending substantially perpendicular to said support wall;
   and said slidably supporting means includes a pair of L-shaped rails extending downwardly from opposite sides of said extending wall to support said mounting means.

7. The security box according to claim 6 including:
   L-shaped flanges extending forwardly and from opposite sides of said support wall;
   and one of said L-shaped flanges being said lock cooperating means.

8. The security box according to claim 7 in which:
   said spacing means includes a plurality of countersunk mounting holes in said support wall;

and each of said countersunk mounting holes receives means for mounting said support wall on a building wall.

9. The security box according to claim 8 including:
said support wall of said base having flange means extending forwardly from its bottom and substantially perpendicular thereto;
and said receiving means of said support wall of said base including notches between said flange means extending forwardly from the bottom of said support wall of said base and an end of each of said L-shaped flanges extending forwardly and from opposite sides of said support wall to receive a portion of said bottom wall of said cover.

10. The security box according to claim 9 in which said cable access means is only in said bottom wall of said cover.

11. The security box according to claim 10 in which said mounting means includes:
a flat plate for supporting the cable TV connectors;
and said flat plate having means on opposite sides for support by said L-shaped rails of said slidably supporting means.

12. The security box according to claim 9 in which said cable access means is only in each of said side walls of said cover.

13. The security box according to claim 12 in which said mounting means includes:
a substantially T-shaped plate having:
a first portion supported by said L-shaped rails of said slidably supporting means;
and a second portion extending from said first portion substantially perpendicular thereto for supporting the cable TV connectors.

* * * * *